(12) United States Patent
Inagaki et al.

(10) Patent No.: US 7,767,020 B2
(45) Date of Patent: Aug. 3, 2010

(54) METHOD FOR MANUFACTURING SINGLE CRYSTAL SEMICONDUCTOR

(75) Inventors: Hiroshi Inagaki, Nagasaki (JP);
Masanori Honma, Nagasaki (JP);
Shigeki Kawashima, Nagasaki (JP);
Masahiro Shibata, Nagasaki (JP)

(73) Assignee: Sumco Techxiv Corporation, Nagasaki (JP)

( * ) Notice: Subject to any disclaimer, the term of this patent is extended or adjusted under 35 U.S.C. 154(b) by 13 days.

(21) Appl. No.: 10/589,587

(22) PCT Filed: Feb. 18, 2005

(86) PCT No.: PCT/JP2005/002628

§ 371 (c)(1), (2), (4) Date: Aug. 16, 2006

(87) PCT Pub. No.: WO2005/080647

PCT Pub. Date: Jan. 9, 2005

(65) Prior Publication Data

US 2007/0193500 A1    Aug. 23, 2007

(30) Foreign Application Priority Data

Feb. 19, 2004  (JP) .............................. 2004-043218

(51) Int. Cl.
*C30B 15/20* (2006.01)
(52) U.S. Cl. .................. 117/14; 117/13; 117/15; 117/214; 117/217; 117/932
(58) Field of Classification Search ............. 117/13, 117/14, 15, 214, 217, 932
See application file for complete search history.

(56) References Cited

U.S. PATENT DOCUMENTS

| | | | | |
|---|---|---|---|---|
| 5,379,717 A * | 1/1995 | Yoshida et al. | ................. | 117/14 |
| 6,113,686 A * | 9/2000 | Iino et al. | .................... | 117/13 |
| 2002/0029738 A1* | 3/2002 | Takanashi et al. | ........... | 117/217 |
| 2003/0154906 A1* | 8/2003 | Weber et al. | ................... | 117/13 |

FOREIGN PATENT DOCUMENTS

JP    61-222985    10/1986

(Continued)

OTHER PUBLICATIONS

International Search Report related to PCT/JP2005/002628.

*Primary Examiner*—Robert M Kunemund
(74) *Attorney, Agent, or Firm*—Husch Blackwell Sanders LLP Welsh & Katz

(57) ABSTRACT

A method for manufacturing a single crystal semiconductor, in which, in a process of pulling up the single crystal semiconductor from melt for growing it, an impurity is incorporated more uniformly into the single crystal semiconductor so that a variation in impurity concentration across the semiconductor wafer surface can be reduced, and thus, the planarity of the wafer can be improved. In the process of pulling-up the single crystal semiconductor (6), fluctuation in a pulling-up speed is controlled, whereby the variation in concentration of the impurity in the single crystal semiconductor (6) is reduced. Especially, a width of speed fluctuation (ΔV) in 10 seconds is adjusted to less than 0.025 mm/min. Furthermore, in carrying out the control for adjusting the pulling-up speed such that a diameter of the single crystal semiconductor (6) becomes a desired diameter, a magnetic field having strength of 1,500 gauss or more is applied to the melt (5).

6 Claims, 4 Drawing Sheets

FOREIGN PATENT DOCUMENTS

| JP | 01-192795 | 8/1989 |
| JP | 04-108686 | 4/1992 |
| JP | 09-002893 | 1/1997 |
| JP | 11-116390 | 4/1999 |
| JP | 200-247788 | 9/2000 |
| JP | 2003-246695 | 9/2003 |

* cited by examiner

| WIDTH OF SPEED FLUCTUATION IN EVERY 10 SEC ΔV (mm/min) | VARIATION IN IMPURITY CONCENTRATION (STRIATION) |
|---|---|
| 0.011 | NOT CAUSED |
| 0.015 | NOT CAUSED |
| 0.020 | NOT CAUSED |
| 0.025 | CAUSED |
| 0.030 | CAUSED |
| 0.033 | CAUSED |

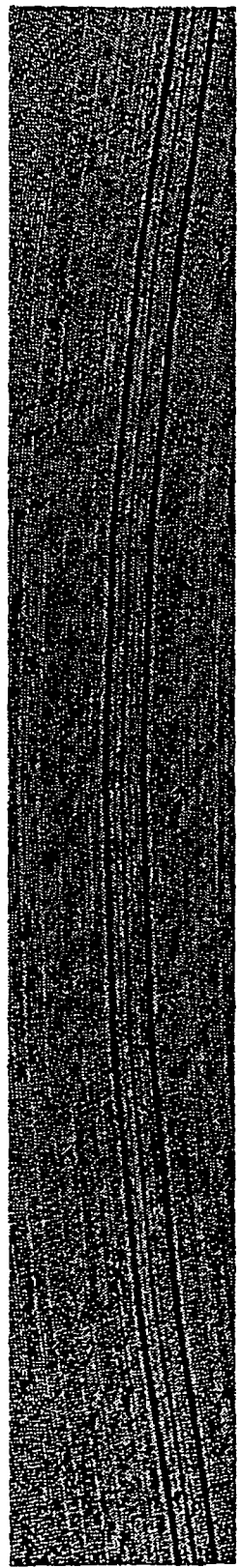
FIG.6A X-RAY PHOTOGRAPH OF CRYSTAL SECTION
INTERVALS BETWEEN STRIATIONS ARE NON-UNIFORM AND THE STRIATIONS ARE THICK.
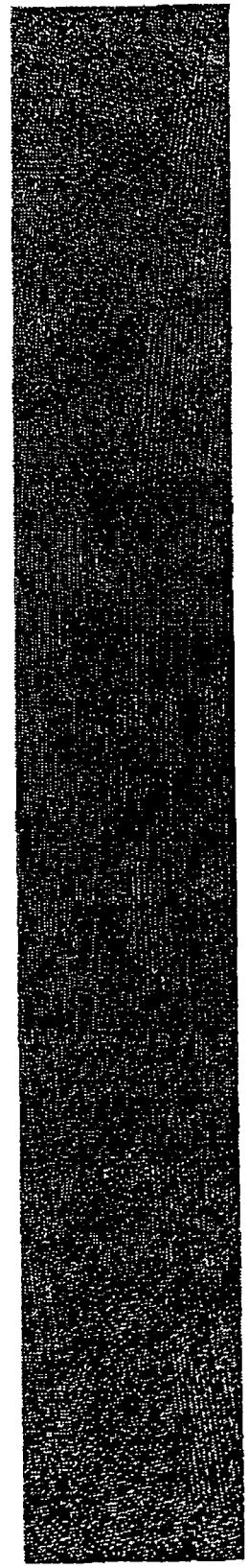
FIG.6B INTERVALS BETWEEN STRIATIONS ARE EQUAL AND THE STRIATIONS ARE DENSE AND THIN.

METHOD FOR MANUFACTURING SINGLE CRYSTAL SEMICONDUCTOR

TECHNICAL FIELD

The present invention relates to a method for manufacturing a single crystal semiconductor, such as single crystal silicon, using the CZ method (Czochralski Method), and a method for manufacturing a single crystal semiconductor such that semiconductor wafers having a high planarity can be acquired.

BACKGROUND ART

As one of the manufacturing methods for single crystal silicon, the CZ method is available.

The single crystal silicon (ingot) which is grown and pulled up by the CZ method is sliced, polished, and etched to be provided as a silicon wafer for manufacturing semiconductor devices.

More specifically, an impurity, such as boron B or the like, is added into melt in order to provide a desired resistivity for the silicon wafer before the single crystal silicon is pulled up from the melt.

Herein, in the process of pulling-up the single crystal silicon for growing it, the impurity is not uniformly incorporated. Therefore, when a silicon wafer acquired from the single crystal silicon (ingot) which has been pulled up for growing is cut in the longitudinal direction (perpendicularly with respect to the wafer surface), striations according to a variation in concentration of the impurity are observed. And across the wafer surface, the variation in impurity concentration is observed as ring-shaped figures.

On the other hand, in recent years, a high-level specification for planarity of the silicon wafer is required for some types of semiconductor devices.

As a related art in connection with the present invention, the following patent literature 1 is available.

This patent literature 1 discloses the invention in which the variation in oxygen concentration appearing across the silicon wafer surface is reduced, paying attention to the oxygen incorporated from the quartz crucible into the single crystal silicon through the melt. The technique used in the patent literature is to reduce the variation in oxygen concentration across the silicon wafer surface by setting the ration h/d between the overlap length h of the slit of the heater and the inner diameter d of the heater to 0.70 or under.

Patent literature 1: Japanese Patent Application Laid-Open No. 11-116390

DISCLOSURE OF THE INVENTION

Problem to Be Solved by the Invention

The present inventor has obtained a new finding that a variation in concentration of the impurity across the silicon wafer surface is developed as a variation in hardness, which can have an influence on the planarity of the wafer. Especially when an impurity is added at a high concentration, the variation in hardness tends to be occurred.

In other words, when an impurity is added, the crystal hardening effect is caused. Therefore, the variation in impurity concentration across the silicon wafer surface is developed as the variation in hardness, and if the silicon wafer is polished in the polishing process, minute irregularities are produced due to the difference in hardness between portions of the wafer surface. Likewise, if the silicon wafer is etched in the etching process, the variation in concentration produces minute irregularities. The minute irregularities thus formed may degrade the planarity.

The present invention has been made in view of such a situation, and the purpose thereof is to provide a method for manufacturing a single crystal semiconductor that, in the process of pulling up the single crystal semiconductor from the melt for growing it, incorporates an impurity more uniformly into the single crystal semiconductor, reducing the variation in impurity concentration across the semiconductor wafer surface, and thus, improving the planarity of the wafer.

The focus of invention as stated in the above-mentioned patent literature 1 is placed on the oxygen incorporated from the quartz crucible into the single crystal semiconductor through the melt, reducing a variation in oxygen concentration across the wafer surface, and thus differs from the present invention which pays attention to the impurity (such as boron, or the like) incorporated from the melt into the single crystal semiconductor, reducing the variation in impurity concentration across the wafer surface.

Means to Solve the Problem

A first invention provides a method for manufacturing a single crystal semiconductor, in which a seed crystal is dipped into melt in a crucible and is pulled up to manufacture the single crystal semiconductor having an impurity added thereto, wherein, in a process of pulling up the single crystal semiconductor, fluctuation in a pulling-up speed is controlled to reduce a variation in concentration of the impurity in the single crystal semiconductor.

A second invention provides a method for manufacturing a single crystal semiconductor, in which a seed crystal is dipped into melt in a crucible and is pulled up to manufacture the single crystal semiconductor having an impurity added thereto, wherein, in a process of pulling up the single crystal semiconductor, a pulling-up speed fluctuation width in 10 seconds is adjusted to less than 0.025 mm/min.

A third invention provides the method for manufacturing the single crystal semiconductor of claim 1, wherein, when the pulling-up speed is controlled such that a diameter of the single crystal semiconductor is adjusted to a desired diameter, a magnetic field of 1500 gauss or above is applied to the melt.

A fourth invention provides the method for manufacturing the single crystal semiconductor of claim 2, wherein, when the pulling-up speed is controlled such that a diameter of the single crystal semiconductor is adjusted to a desired diameter, a magnetic field of 1500 gauss or above is applied to the melt.

A fifth invention provides the method for manufacturing the single crystal semiconductor of any one of claims 1 to 4, wherein the impurity to be added into the single crystal semiconductor is boron B or gallium Ga, and the impurity concentration is 8.0e17 atoms/cc or more.

A sixth invention provides the method for manufacturing the single crystal semiconductor of any one of claims 1 to 4, wherein the impurity to be added into the single crystal semiconductor is phosphorus P, antimony Sb, or arsenic As, and the impurity concentration is 5.0e17 atoms/cc or more.

The present inventor assumed that the intervals between striations appearing when a single crystal silicon ingot is cut perpendicularly with respect to the wafer surface are non-uniform, and across the wafer surface, the variation in impurity concentration appearing as ring-shaped figures is caused because:

1) a non-uniform flow is formed in the convection of the melt 5 when the single crystal silicon 6 is pulled up, and there occurs a change in concentration of the impurity incorporated from the melt 5 into the single crystal silicon 6;

2) the single crystal silicon 6 is grown while it is rotated, and thus a temperature difference is produced, resulting in the occurrence of a remelt (a phenomenon in which the crystal once solidified is melted back), whereby there occurs a change in concentration of the impurity incorporated from the melt 5 into the single crystal silicon 6; and 3) the slope of the growth interface (the solid-liquid interface), which is the junction between the single crystal silicon 6 and the melt 5, is steep, and thus along the wafer longitudinal section, a number of striations (where there is the variation in impurity concentration) which intersect the growth interface are observed.

Then, the present inventor considered that the following concept is important in order to render uniform the intervals between striations appearing when a single crystal silicon ingot is cut perpendicularly with respect to the wafer surface (and render the striations dense and thin), and reduce (eliminate) the variation in impurity concentration across the wafer surface appearing as ring-shaped figures.

4) in order to avoid the occurrence of remelt, the fluctuation in pulling-up speed should be controlled.

And, on the above-mentioned assumption, experiments were carried out to obtain the results as given in FIG. 3, which proves that the above-mentioned assumption is correct.

In other words, according to the first invention, by controlling the fluctuation in pulling-up speed in the process of pulling up the single crystal semiconductor 6, the variation in concentration of the impurity in the single crystal semiconductor 6 could be reduced.

According to the second invention, by adjusting the pulling-up speed fluctuation width $\Delta V$ in every 10 seconds to under 0.025 mm/min in the process of pulling up the single crystal semiconductor 6, the variation in impurity concentration in the single crystal semiconductor 6 could be reduced (see FIG. 3).

Furthermore, in carrying out the control for adjusting the pulling-up speed such that a diameter of the single crystal semiconductor 6 becomes a desired diameter, applying a magnetic field with a strength of 1500 gauss or over to the melt 5 is effective for control of the fluctuation in pulling-up speed (the third invention and the fourth invention). In other words, by applying a magnetic field with a strength 1500 gauss or more, the convection of the melt 5 is controlled, whereby the temperature fluctuation of the melt 5, especially, the temperature fluctuation at the growth interface (the solid-liquid interface) is controlled, resulting in the amount of increase or decrease in pulling-up speed at the time of control being reduced, which allowed the fluctuation in pulling-up speed to be controlled.

According to the present invention, the variation in impurity concentration is lowered, thus the variation in hardness across the semiconductor wafer surface is reduced. And when polishing or etching is provided, generation of minute irregularities due to the variation in concentration is eliminated (or reduced), whereby the planarity after machining is further improved.

The reason why the variation in impurity concentration can have an influence on the planarity can be assumed that the impurity is added to such a high concentration that a crystal hardening effect is produced.

Therefore, when the impurity is boron B or gallium Ga, adding it to a concentration of over 8.0e17 atoms/cc will especially enhance the effects of the present invention (the fifth invention).

In addition, when the impurity is phosphorus P, antimony Sb, or arsenic As, adding it to a concentration of over 5.0e17 atoms/cc will especially enhance the effects of the present invention (the sixth invention).

However, according to the present invention, by controlling the fluctuation in pulling-up speed regardless of the magnitude of the impurity concentration, the effect that the variation in impurity concentration across the silicon wafer surface can be reduced is obtained, thus the present invention can be implemented without being limited to the high concentrations as specified by the fifth invention and the sixth invention.

In addition, the present invention is also applicable to pulling-up a single crystal semiconductor of other material, such as gallium arsenide or the like, than silicon.

BRIEF DESCRIPTION OF DRAWINGS

FIG. 6A and FIG. 6B are photos of the striations in the longitudinal section of the wafer when the pulling-up speed fluctuation widths were 0.033 mm/min and 0.011 mm/min, respectively.

BEST MODE FOR CARRYING OUT THE INVENTION

Hereinbelow, an apparatus of the embodiment will be described with reference to the drawings.

Figure 1:
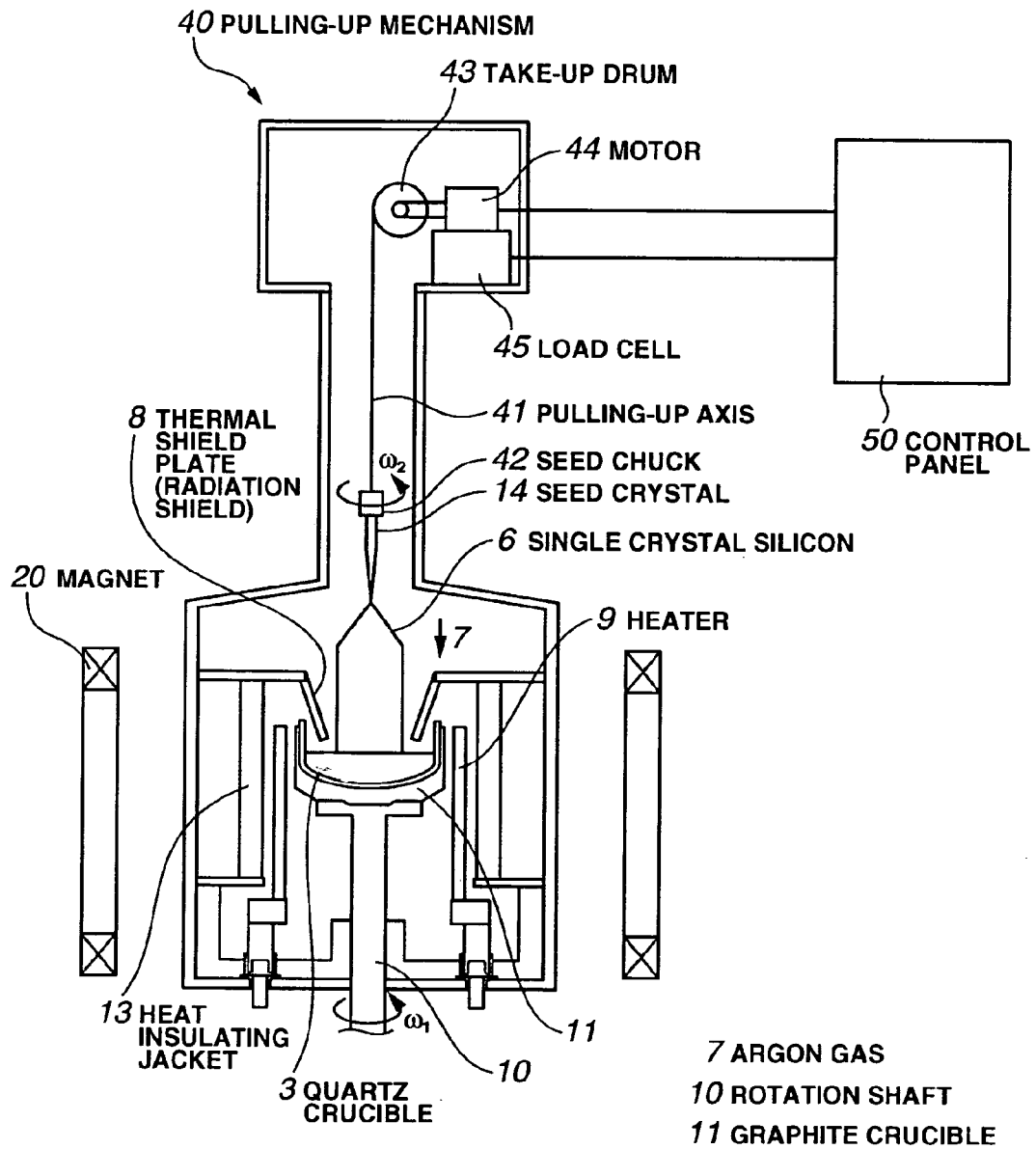
FIG. 1 is a drawing illustrating the single crystal pulling-up device of the embodiment.

FIG. 1 is a schematic sectional view of the embodiment, illustrating the configuration thereof As shown in FIG. 1, a single crystal pulling-up device 1 of the embodiment comprises a CZ furnace (chamber) 2 as a single crystal pulling-up vessel. The single crystal pulling-up device 1 in FIG. 1 is an apparatus, for example, suited for manufacturing a single crystal silicon ingot 6 having a diameter of 200 mm to 300 mm.

In the CZ furnace 2, a quartz crucible 3 for melting a raw material of polysilicon and accommodating it as a melt 5 is provided. For pulling up a single crystal silicon having a diameter of 300 mm, a polysilicon material weighing 300 kg or so is charged in the quartz crucible 3. The outside of the quartz crucible 3 is covered with a graphite crucible 11. At the side of the quartz crucible 3 outside thereof, a cylindrical heater 9 for heating the polysilicon raw material in the quartz crucible 3 to melt it is provided. The output (power in kW) of the heater 9 is controlled for adjusting the amount of heat applied to the melt 5. For example, the temperature of the melt 5 is detected, by using the detected temperature as a feedback amount, the output of the heater 9 is controlled such that the temperature of the melt 5 is at the target temperature.

In the embodiment, the heater 9 heats the melt 5 from outside. However, the heating means is not limited to the heater, and any type of heating means may be used. For example, the heating method by electromagnetism, or by laser irradiation may be adopted.

Between the heater 9 and the inner wall of the CZ furnace 2, a heat insulating jacket 13 is provided.

A pulling-up mechanism 40 is provided above the quartz crucible 3. The pulling-up mechanism 40 includes a pulling-up axis 41 and a seed chuck 42 at the tip of the pulling-up axis 41. The seed chuck 42 holds a seed crystal 14. Herein, the pulling-up axis 41 is a wire, and the wire 41 as the pulling-up axis is wound up by a take-up drum 43. The take-up drum 43 is rotated by a motor 44. The motor 44 is provided with a load cell 45 for detecting the load imposed on the motor 44 to detect the weight (crystal weight) of the single crystal silicon 6 to be pulled up. The control panel 50 receives the value detected by the load cell 44 as the feedback amount, and outputs a drive instruction for the motor 44, implementing the feedback control with the contents later described using FIG. 2.

In FIG. 1, the pulling-up axis 41 is configured using a wire, but it may be configured using a shaft.

In the quartz crucible 3, the polysilicon (Si) material is heated to melt. Once the temperature of the melt 5 is stabilized, the pulling-up mechanism 40 is operated to pull up the single crystal silicon 6 (the single crystal silicon ingot) from the melt 5. In other words, the pulling-up axis 41 is lowered, and the seed crystal 14 held by the seed chuck 42 at the tip of the pulling-up axis 41 is dipped into the melt 5. After thoroughly dipping the seed crystal 14 into the melt 5, the pulling-up axis 41 is raised. As the seed crystal 14 held by the seed chuck 42 is raised, a single crystal silicon is grown. In pulling-up, the quartz crucible 3 is rotated by a rotation axis 10 at a speed of $\omega 1$ (for example, 0.1 to 0.2 rpm). In addition, the pulling-up axis 41 in the pulling-up mechanism 40 is rotated in the same direction as the rotation axis 10 at a speed of $\omega 2$.

In addition, the rotation axis 10 can be driven in the vertical direction for vertically moving the quartz crucible 3 to a desired position.

By insulating the inside of the CZ furnace 2 from the open air, the inside of the CZ furnace 2 is maintained at a vacuum level (for example, of 20 Torr or so). In other words, an argon gas 7 as an inert gas is supplied to the CZ furnace 2, and is pumped out from the exhaust port of the CZ furnace 2, whereby the inside of the furnace 2 is vacuumed to a prescribed pressure.

During the process of pulling-up the single crystal (in one batch), various evaporants are generated in the inside of the CZ furnace 2. Then, the argon gas 7 is supplied to the CZ furnace 2 to be exhausted together with the evaporants to the outside of the CZ furnace 2 for purging the CZ furnace 2 of the evaporants to render it clean. The flow rate for supplying the argon gas 7 is set for each step in one batch.

As the single crystal silicon 6 is pulled up, the quantity of the melt 5 is reduced. With the reduction in the quantity of the melt 5, the contact area between the melt 5 and the quartz crucible 3 is changed, resulting in the amount of oxygen dissolved from the quartz crucible 3 being changed. This change has an effect on the distribution of oxygen concentration in the single crystal silicon 6 which is pulled up. Then, in order to avoid this, the polysilicon raw material or the single crystal silicon raw material may be additionally supplied to the inside of the quartz crucible 3 during or after the pulling up that has been reduced in the quantity of the melt 5.

Around the single crystal silicon 6 above the quartz crucible 3, a heat shield plate 8 (gas rectifying cylinder/radiation shield) substantially in the shape of an inverted frustum of a cone is provided. The heat shield plate 8 is supported by the heat insulating jacket 13. The heat shield plate 8 introduces the argon gas 7 as the carrier gas supplied from above into the inside of the CZ furnace 2 to the center of the melt surface 5a, and further causes it to pass over the melt surface 5a toward the peripheral edge part of the melt surface 5a. Then, the argon gas 7 is discharged from the exhaust port provided at the bottom of the CZ furnace 2 together with the gases evaporated from the melt 5. Therefore, the flow rate of the gas on the liquid surface can be stabilized, which allows the amount of oxygen evaporated from the melt 5 to be stabilized.

In addition, the heat shield plate 8 as the radiation shield thermally insulates and shields the seed crystal 14 and the single crystal silicon 6 grown by the seed crystal 14 from the radiation heat generated in the high temperature area, such as the quartz crucible 3, the melt 5, the heater 9, and the like. In addition, the heat shield plate 8 prevents an impurity (for example, silicon oxide), or the like which occurs in the inside of the furnace from attaching onto the single crystal silicon, and from resulting in the growing of the single crystal being impeded. The size of the gap G between the lower end of the heat shield plate 8 and the melt surface 5a can be adjusted by vertically moving the rotation axis 10 to change the vertical position of the quartz crucible 3. In addition, the heat shield plate 8 may be vertically moved by means of an elevating device for adjustment of the gap G.

Outside and around the CZ furnace 2, a magnet 20 for applying a magnetic field (a horizontal magnetic field) to the melt 5 in the inside of the quartz crucible 3 is provided.

Figures 2, 3:
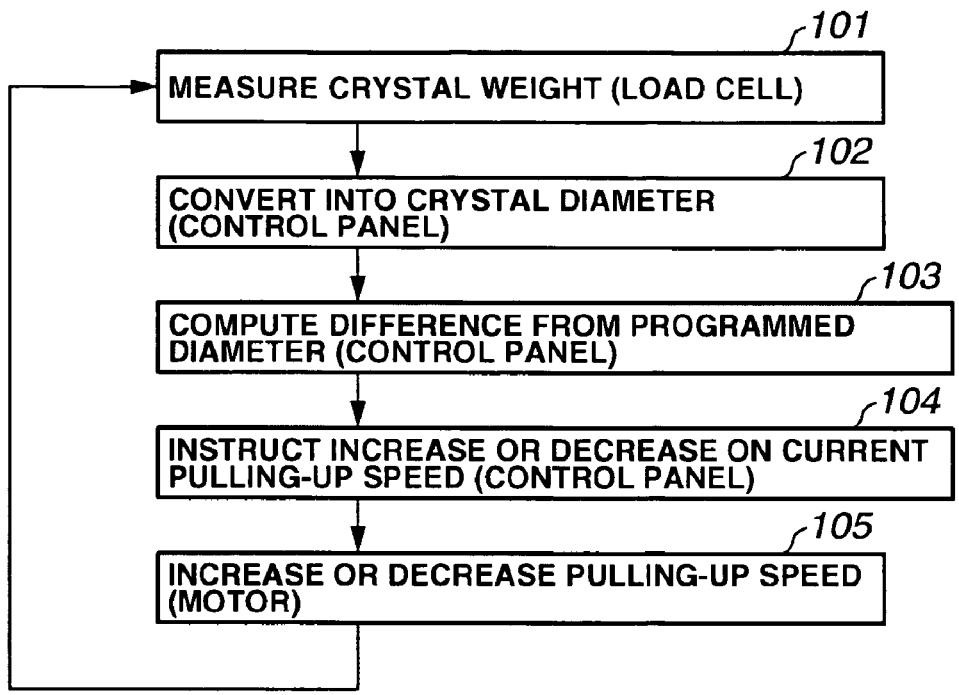
FIG. 2 is a flowchart illustrating the contents of the control of the embodiment.
FIG. 3 is a table which gives the results of the experiments which varied the pulling-up speed fluctuation width in pulling up the single crystal silicon in order to evaluate the variation in impurity concentration across the silicon wafer surface.

FIG. 2 is a flowchart illustrating the contents of the feedback control carried out by the use of a control panel 50.

As shown in FIG. 2, the control panel 50 carries out control by the weight type diameter control method.

Particularly, the load currently imposed on the motor 44, i.e., the current crystal weight is first measured by means of the load cell 45, the measurement being incorporated by the control panel 50 (step 101).

Next, the current crystal weight (the value detected by the load cell 45) that has been incorporated by the control panel 50 is converted into the current diameter (crystal diameter) of the single crystal silicon ingot 6 (step 102).

In the control panel 50, the desired value of diameter for the single crystal silicon ingot 6 (a prescribed value for any portions of the straight body) has been set, and the deviation between this desired value and the current crystal diameter is computed (step 103).

Next, the instruction value to make the computed deviation zero, i.e., the amount of increasing or decreasing the pulling-up speed required for the current pulling-up speed is computed, and the electric current value corresponding to this computed amount of increasing or decreasing the pulling-up speed is outputted to the motor 44 (step 104).

The motor 44 is driven according to the applied electric current, whereby the speed for the pulling-up axis 41, i.e., the pulling-up speed for the single crystal silicon 6 is increased or decreased (step 105).

The control as described above is carried out. And the crystal diameter of the single crystal silicon ingot 6 is maintained at the desired value, and is constant at any part of the straight body section. In this embodiment, the control method using the weight type diameter control has been described. However, a control method using optical method may be applied. That is, the diameter of the single crystal silicon 6 that is being pulling-up may be optically measured, and controlled, based on the optically measured data, such that the diameter becomes the target diameter.

The present inventor assumed that the intervals between striations appearing when a single crystal silicon ingot is cut perpendicularly with respect to the wafer surface are non-uniform, and across the wafer surface, the variation in impurity concentration appearing as ring-shaped figures is caused because:

1) a non-uniform flow is formed in the convection of the melt 5 when the single crystal silicon 6 is pulled up, and there occurs a change in concentration of the impurity incorporated from the melt 5 into the single crystal silicon 6;

2) the single crystal silicon 6 is grown while it is rotated, and thus a temperature difference is produced, resulting in the occurrence of a remelt (a phenomenon in which the crystal once solidified is melted back), whereby there occurs a change in concentration of the impurity incorporated from the melt 5 into the single crystal silicon 6; and 3) the slope of the growth interface (the solid-liquid interface), which is the junction between the single crystal silicon 6 and the melt 5, is steep, and thus a number of striations (where there is the variation in impurity concentration) which intersect the growth interface are observed along the wafer longitudinal section.

Then, the present inventor considered that the following concept is important in order to render uniform the intervals between striations appearing when a single crystal silicon ingot is cut perpendicularly with respect to the wafer surface (and render the striations dense and thin), and to reduce (eliminate) the variation in impurity concentration across the wafer surface appearing as ring-shaped figures.

4) in order to avoid the occurrence of remelt, the fluctuation in pulling-up speed should be controlled.

And, on the above-mentioned assumption, experiments were carried out to obtain the results as given in FIG. 3, which proves that the above-mentioned assumption is correct. In the experiments, the crystal diameter (the diameter of the straight body of the single crystal silicon ingot 6) was set to 300 mm. In addition, boron B was used as the impurity and the concentration was adjusted such that boron B is incorporated into the single crystal silicon 6 at a concentration in the range of 1e18 atoms/cc to 1e19 atoms/cc.

FIG. 3 gives the evaluation result whether the variation in impurity concentration was caused or not caused when the pulling-up speed fluctuation width $\Delta V$ in every 10 seconds was varied in the range of 0.011 mm/min to 0.033 mm/min. For a silicon wafer obtained by slicing the single crystal silicon ingot 6, measurement was made by, for example, the X-ray topography method to evaluate the variation in impurity concentration across the wafer surface (the striations appearing along the wafer longitudinal section). In FIG. 3, for example, while a silicon wafer cut down from the single crystal silicon ingot when the pulling-up speed fluctuation width $\Delta V$ was at 0.020 mm/min was evaluated such that "no variation in impurity concentration was caused", a silicon wafer cut down from the single crystal silicon ingot when the pulling-up speed fluctuation width $\Delta V$ was at 0.025 mm/min was evaluated such that "a variation in impurity concentration was caused."

Figure 4:
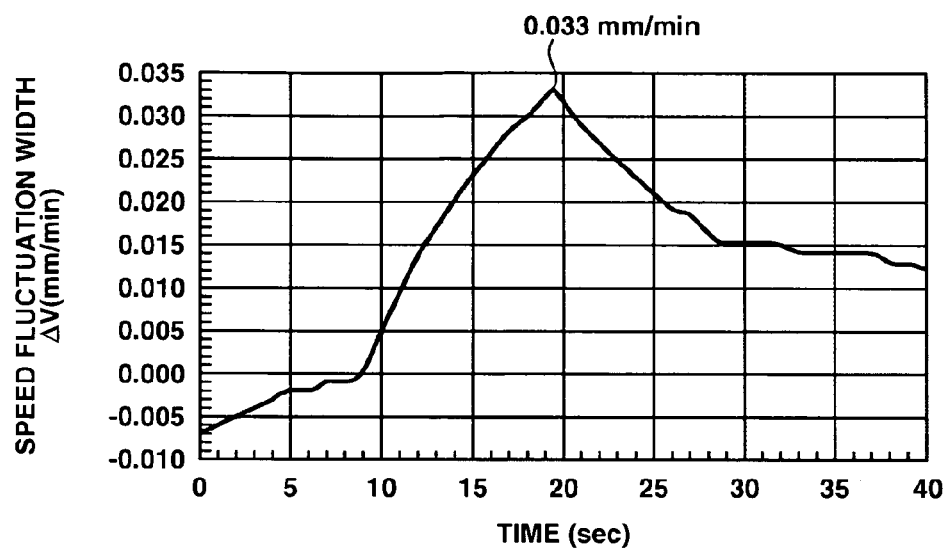
FIG. 4 is a graph providing a speed fluctuation profile with the horizontal axis representing time (sec), and the vertical axis representing the pulling-up speed fluctuation width $\Delta V$ (mm/min) in every 10 seconds, and is a drawing giving a speed fluctuation profile when the maximum value of the pulling-up speed fluctuation width $\Delta V$ was set at 0.033 mm/min.
Figure 5:
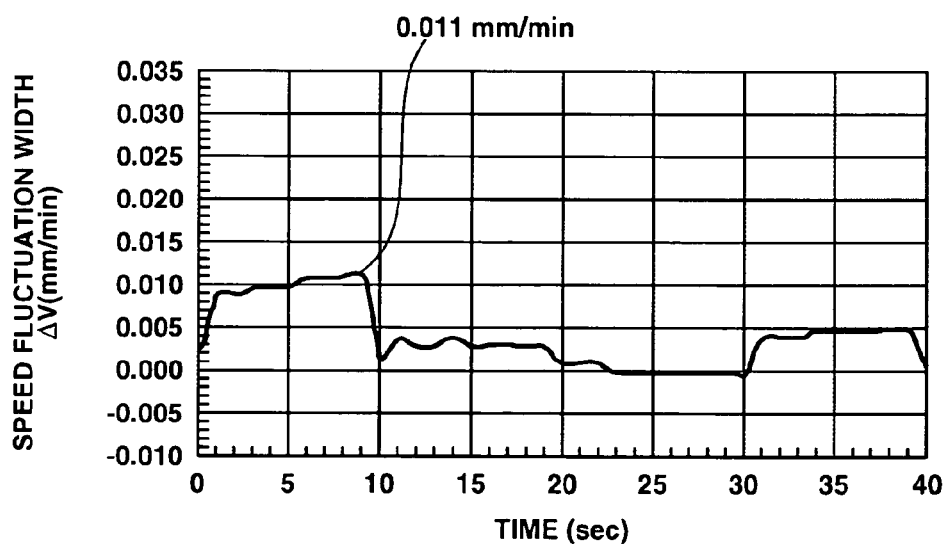
FIG. 5 is a graph providing a speed fluctuation profile with the horizontal axis representing time (sec), and the vertical axis representing the pulling-up speed fluctuation width $\Delta V$ (mm/min) in every 10 seconds, and is a drawing giving a speed fluctuation profile when the maximum value of the pulling-up speed fluctuation width $\Delta V$ was set at 0.011 mm/min.

In addition, FIG. 4 and FIG. 5 show the results of the experiments in which, in the process of growing one single crystal silicon ingot 6, the pulling-up speed fluctuation width $\Delta V$ was changed for the respective portions.

In FIG. 4 and FIG. 5, speed fluctuation profiles are shown with the horizontal axis representing time (sec), and the vertical axis representing the pulling-up speed fluctuation width $\Delta V$ (mm/min) in the past 10 seconds.

FIG. 4 shows a speed fluctuation profile when the pulling-up speed was varied such that the maximum value of the pulling-up speed fluctuation width $\Delta V$ is 0.033 mm/min.

FIG. 5 shows a speed fluctuation profile when the pulling-up speed was varied such that the maximum value of the pulling-up speed fluctuation width $\Delta V$ is 0.011 mm/min.

FIG. 6A shows the result of measuring the striations in the longitudinal section of a silicon wafer by the X-ray topography method. The silicon wafer in this result is cut out from a silicon ingot portion that is a part of the respective portions of the single crystal silicon ingot 6 obtained through the experiment illustrated in FIG. 4, and that is a portion produced when the pulling-up speed fluctuation width $\Delta V$ was 0.033 mm/min.

As can be seen from FIG. 6A, as for the silicon wafer when the pulling-up speed fluctuation width $\Delta V$ was 0.033 mm/min, the intervals between striations in the wafer longitudinal section were not-uniform and the striations were thick, whereby this silicon wafer was evaluated as "a variation in impurity concentration was caused."

As can be seen from FIG. 6B, as for the silicon wafer produced when the pulling-up speed fluctuation width $\Delta V$ was 0.011 mm/min, the intervals between striations in the wafer longitudinal section were equal (uniform), and the striations were dense and thin, whereby the silicon wafer is evaluated as "no variation in impurity concentration was caused."

As described above, by controlling the fluctuation in pulling-up speed during the process of pulling up the single crystal silicon 6, the variation in impurity concentration across the silicon wafer surface could be reduced.

And especially, as shown in FIG. 3, by adjusting the pulling-up speed fluctuation width $\Delta V$ in every 10 seconds to under 0.025 mm/min, the variation in impurity concentration across the silicon wafer surface could be eliminated (see FIG. 3). For example, when the surface of the silicon wafer that was observed as shown in FIG. 6B (obtained with a pulling-up speed fluctuation width $\Delta V$ of 0.011 mm/min, which is under the 0.025 mm/min) was machined by polishing or etching, the planarity was measured to find it extremely high. Then, when this silicon wafer was used to manufacture semiconductor devices, the yield of the product was found to be extremely high.

In the embodiment as described above, the case where boron B is added as an impurity has been explained. However, in the case where gallium Ga, phosphorus P, antimony Sb, or arsenic As is added as an impurity other than boron B, the similar effects to the case where boron B is added can be obtained.

The present inventor also examined the influence which a magnetic field applied to the melt 5 can have on the pulling-up speed fluctuation.

In other words, the present inventor has concluded that, in performing the control for adjusting the pulling-up speed such that a diameter of the single crystal silicon 6 becomes a desired diameter, it is effective to apply a magnetic field with a strength of 1500 gauss or more to the melt 5 so as to further control the fluctuation in pulling-up speed.

First, the reason why the strength has been determined to be 1500 gauss or more was that, if the magnetic field strength is from 1000 to 1500 gauss, there occurs a possibility that an unstable portion where the temperature largely fluctuates is developed in the melt 5, resulting in the diameter of the crystal being fluctuated, and if the magnetic field strength is 1000 gauss or less, the convection suppression effect is decreased, which results in the controllability for crystal diameter being lowered. And, by applying a magnetic field with a strength of 1500 gauss or more, the convection of the melt 5 is controlled, whereby the temperature fluctuation of the melt 5 especially at the growth interface (the solid-liquid interface) is controlled. As a result, the amount of increase or decrease in pulling-up speed at the time of control as illustrated in FIG. 2 could be reduced, which allowed the fluctuation in pulling-up speed to be controlled.

For example, when a polysilicon raw material of 300 kg was charged in the quartz crucible 3, and the single crystal silicon 6 of 300 mm in diameter was pulled up, it was effective to apply a magnetic field of 1500 gauss or over to the melt 5 for controlling the fluctuation in pulling-up speed. In addition, when a polysilicon raw material of 130 kg was charged in the quartz crucible 3, and the single crystal silicon 6 of 200 mm in diameter was pulled up, it was effective to apply a magnetic field of 2000 gauss or over to the melt 5 for controlling the fluctuation in pulling-up speed.

In addition, when, in carrying out the control as shown in FIG. 2, the PID control, the PI control, or the like, is to be performed, the proportional constant, the differential constant, and the integration constant may be adjusted to lower the responsiveness to the temperature fluctuation of the melt 5 for controlling the fluctuation in pulling-up speed.

As described above, according to the present embodiment, in the process of pulling up the single crystal silicon 6, the fluctuation in pulling-up speed is controlled to lower the variation in impurity concentration across the silicon wafer surface. Thus, the variation in hardness across the silicon wafer surface is reduced, and when polishing or etching is applied, generation of minute irregularities due to the variation in concentration is eliminated (or minimized), whereby the planarity after machining is further improved.

Next, the magnitude of the concentration of the impurity that is added into the single crystal silicon 6 will be discussed.

The reason why the variation in impurity concentration can have an influence on the planarity can be assumed that the impurity is added at such a high concentration that a crystal hardening effect is produced.

Therefore, when the impurity is boron B or gallium Ga, the effect of the present invention can be further enhanced by adding the impurity at high concentration such as 8.0e17 atoms/cc concentration or more.

Therefore, when the impurity is phosphorus P, antimony Sb, or arsenic As, the effect of the present invention can be further enhanced by adding the impurity at high concentration such as 5.0e17 atoms/cc concentration or more.

However, according to the present invention, by controlling the fluctuation in pulling-up speed regardless of the magnitude of the impurity concentration, the effect that the variation in impurity concentration across the silicon wafer surface can be reduced is obtained. Thus, the present invention can be implemented without being limited to the above-mentioned high concentrations.

In the present embodiment, the case where a horizontal magnetic field is applied to the melt 5 has been assumed for explanation. However, the system may be configured such that a cusp magnetic field is applied to the melt 5.

In addition, in the present embodiment, the necking treatment may or may not be performed in pulling up the single crystal silicon 6. Especially, if the impurity is added into the seed crystal 14 at a concentration similar to that of the impurity to be added into the melt 5, the present invention can be applied without performing the necking treatment.

In addition, in the present embodiment, the case where the single crystal silicon 6 is pulled up by the single crystal pulling-up device 1 having a single heater 9 at the side of a quartz crucible 3 has been explained. However, the present invention is, of course, applicable for the case where the single crystal silicon is pulled up with the single crystal pulling up device with multi-heater, that is, the configuration in which plural side-heaters are provided at the side of the quartz crucible 3 along with the longitudinal direction, or the configuration in which a side-heater is provided at the side of the quartz crucible 3 and a bottom-heater is provided at the bottom of the quartz crucible 3.

INDUSTRIAL APPLICABILITY

The present invention is also applicable to pulling-up a single crystal semiconductor of other material, such as gallium arsenide or the like, than silicon.

The invention claimed is:

1. A method for manufacturing a single crystal semiconductor, in which a seed crystal is dipped into melt in a crucible and is pulled up at a pulling-up speed corresponding to a pulling-up instruction to manufacture the single crystal semiconductor having an impurity added thereto, including the steps of:
    determining a deviation between a target value of a crystal diameter and a current value of the crystal diameter,
    controlling the amount of increase/decrease in speed from a current pulling-up speed to make the amount of the pulling-up instruction for making the deviation of the crystal diameter zero and setting a limit to a range of the pulling-up speed such that a pulling-up speed fluctuation in 10 seconds is less than 0.025 mm/min, and,
    outputting the pulling-up instruction to a pulling up mechanism to increase/decrease the pulling-up speed by the controlled amount of increase/decrease in speed from the current pulling-up speed, and pulling up the single crystal semiconductor.

2. The method for manufacturing the single crystal semiconductor of claim 1, wherein,
    when the single crystal semiconductor is pulled up, a magnetic field of 1500 gauss or above is applied to the melt.

3. The method for manufacturing the single crystal semiconductor of claim 1, wherein
    the impurity to be added into the single crystal semiconductor is boron B or gallium Ga, and the impurity concentration is 8.0e17 atoms/cc or more.

4. The method for manufacturing the single crystal semiconductor of claim 1, wherein
    the impurity to be added into the single crystal semiconductor is phosphorus P, antimony Sb, or arsenic As, and the impurity concentration is 5.0e17 atoms/cc or more.

5. The method for manufacturing the single crystal semiconductor of claim 1, wherein
    The current value of the crystal diameter is determined by the weight of the crystal.

6. The method for manufacturing the single crystal semiconductor claim 1, wherein
    The current value of the crystal diameter is determined by optical method.

* * * * *